(12) United States Patent
Kakkar et al.

(10) Patent No.: US 12,402,465 B2
(45) Date of Patent: Aug. 26, 2025

(54) COLOR TUNABLE LIGHT EMITTING DEVICES

(71) Applicant: LUMILEDS LLC, San Jose, CA (US)

(72) Inventors: Varun Dev Kakkar, Eindhoven (NL); Mehdi Aas, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 512 days.

(21) Appl. No.: 17/992,336

(22) Filed: Nov. 22, 2022

(65) Prior Publication Data

US 2023/0187471 A1 Jun. 15, 2023

Related U.S. Application Data

(60) Provisional application No. 63/289,510, filed on Dec. 14, 2021.

(51) Int. Cl.
*H10H 29/14* (2025.01)

(52) U.S. Cl.
CPC .................... *H10H 29/142* (2025.01)

(58) Field of Classification Search
None
See application file for complete search history.

(56) References Cited

U.S. PATENT DOCUMENTS

| | | | |
|---|---|---|---|
| 9,562,671 B2 | 2/2017 | David | |
| 2004/0173806 A1* | 9/2004 | Chua | H10H 20/8514 257/98 |
| 2006/0091779 A1* | 5/2006 | Takeda | F21S 41/176 313/487 |
| 2009/0086475 A1 | 4/2009 | Caruso et al. | |
| 2009/0231832 A1* | 9/2009 | Zukauskas | H10H 20/8513 362/84 |
| 2010/0315012 A1* | 12/2010 | Kim | H05B 45/00 257/E33.056 |
| 2012/0087127 A1* | 4/2012 | Veerasamy | G02F 1/133608 362/249.02 |
| 2013/0234622 A1 | 9/2013 | Tanaka et al. | |
| 2014/0034991 A1 | 2/2014 | McKenzie et al. | |

(Continued)

FOREIGN PATENT DOCUMENTS

KR 20130099951 A 9/2013
WO 2012170066 A1 12/2012

OTHER PUBLICATIONS

From KIPO as the ISA, Notification of Transmittal of the International Search Report and the Written Opinion of the International Searching Authority, or the Declaration, Apr. 3, 2023, 12 pages.

(Continued)

*Primary Examiner* — Bilkis Jahan

(57) ABSTRACT

The output spectrum of a light emitting device comprising LEDs and/or pcLEDs is tunable by controlling emission from an activating LED to activate absorption by a photochromic material in the light output optical path of the device, or to induce emission from a wavelength converting material not otherwise active during operation of the light emitting device, or to activate absorption by a photochromic material in the light output optical path of the device and to induce emission from a wavelength converting material not otherwise active during operation of the light emitting device.

24 Claims, 10 Drawing Sheets

(56) References Cited

U.S. PATENT DOCUMENTS

2014/0232257 A1* 8/2014 Watanabe ............ H05B 33/12
313/503
2017/0030555 A1* 2/2017 Lalicki .................... F21V 9/30

OTHER PUBLICATIONS

From the International Bureau of WIPO, "Notification Concerning Transmittal of International Preliminary Search Report on Patentability (Chapter I of the Patent Cooperation Treaty)", PCT/US2022/050728, Jun. 27, 2024, 6 Pages.

* cited by examiner

COLOR TUNABLE LIGHT EMITTING DEVICES

CROSS-REFERENCE TO RELATED APPLICATIONS

This application claims benefit of priority to U.S. Provisional Patent Application No. 63/289,510 filed Dec. 14, 2021, which is incorporated herein by reference in its entirety.

FIELD OF THE INVENTION

The invention relates generally to LEDs, pcLEDs, LED arrays, pcLED arrays, and color tunable light sources comprising LEDs, pcLEDs, LED arrays or pcLED arrays.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphor-converted LEDs may be designed so that all the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Inorganic LEDs and pcLEDs have been widely used to create different types of displays, matrices and light engines including automotive adaptive headlights, augmented-reality (AR) displays, virtual-reality (VR) displays, mixed-reality (MR) displays (AR, VR, and MR systems referred to herein as visualization systems), smart glasses and displays for mobile phones, smart watches, monitors and TVs, and flash illumination for cameras in mobile phones. Individual LEDs or pcLEDs in these architectures can have an area of a few square millimeters down to a few square micrometers (e.g., microLEDs) depending on the matrix or display sized and its pixel per inch requirements.

Tunable light sources comprising LEDs and pcLEDs are increasingly important. Generally, such devices comprise two or more LEDs or pcLEDs configured to emit different colors of light, with their emission mixed to form the output of the device. The color of the light output from the device may be tuned by controlling the drive power to the different colored LEDs or pcLEDs contributing to the output. This arrangement can provide good color tuning flexibility but may be expensive due to the large number of LEDs and pcLEDs required as well as the expense of the control and drive electronics.

SUMMARY

This specification discloses color tunable light emitting devices comprising LEDs and/or pcLEDs. The output spectrum of these light emitting devices is tunable by controlling emission from an activating LED to activate absorption by a photochromic material in the light output optical path of the device, or to induce emission from a wavelength converting material not otherwise active during operation of the light emitting device, or to activate absorption by a photochromic material in the light output optical path of the device and to induce emission from a wavelength converting material not otherwise active during operation of the light emitting device.

In one aspect of the invention, a light emitting device comprises at least one semiconductor LED configured to emit light in a first wavelength range, a wavelength converting material disposed in an optical path for light emitted from the semiconductor LED and configured to absorb light in the first wavelength range and in response emit light in a second wavelength range of longer wavelength, at least one activating LED configured to emit light in a third wavelength range at shorter wavelengths than the first wavelength range, and a photochromic material disposed in an optical path for light emitted from the activating LED and the wavelength converting material or from the activating LED, the wavelength converting material, and the semiconductor LED.

The photochromic material is convertible from a non-absorbing state to an absorbing state by a reversible photochemical change to the photochromic material induced by absorbing light in the third wavelength range. When in the absorbing state, the photochromic material absorbs light in the first wavelength range and the second wavelength range more strongly than when it is in the non-absorbing state.

The first wavelength range may be for example in the blue, violet, or ultraviolet portion of the optical spectrum. The third wavelength range may be, for example, 380 nm to 400 nm (UV-A) or 400 nm to 420 nm (deep blue).

The wavelength converting material may comprise for example two or more phosphors of different colors. Any suitable phosphor materials may be used.

An output from the light emitting device formed from light emitted by the wavelength converting material and light emitted by the semiconductor LED may for example be white with a first color point when the photochromic material is in the non-absorbing state and white with a color point different from the first color point when the photochromic material is in the absorbing state.

The photochromic material may be or comprise silver chloride or other silver halides, for example. Any suitable photochromic material may be used.

The wavelength converting material may be disposed on the at least one semiconductor LED or remote from the at least one semiconductor LED.

The photochromic material may for example be disposed remote from the wavelength converting material and the at least one semiconductor LED, or disposed together with a wavelength converting material remote from the at least one semiconductor LED.

The light emitting device may comprise a second wavelength converting material disposed in an optical path for light emitted from the activating LED and configured to absorb light in the third wavelength range and in response emit light in a fourth wavelength range of longer wavelength than the third wavelength range. The second wavelength converting material is not strongly absorbing for light in the first wavelength range. Any suitable UV-A or deep blue absorbing phosphor may be used as the second wavelength converting material.

A method for operating this light emitting device comprises adjusting a drive power to the activating LED to adjust a spectrum for light output from the light emitting device. For example the method may comprise adjusting a drive power to the activating LED to adjust a color point or correlated color temperature of white light output from the light emitting device.

In another aspect of the invention, a light emitting device comprises at least one semiconductor LED configured to emit light in a first wavelength range, a first wavelength converting material disposed in an optical path for light emitted from the semiconductor LED and configured to absorb light in the first wavelength range and in response emit light in a second wavelength range of longer wavelength, at least one activating LED configured to emit light in a third wavelength range at shorter wavelengths than the first wavelength range, and a second wavelength converting material disposed in an optical path for light emitted from the activating LED.

The second wavelength converting material is configured to absorb light in the third wavelength range and in response emit light in a fourth wavelength range of longer wavelength than the third wavelength range. The second wavelength converting material is not strongly absorbing for light in the first wavelength range. Any suitable UV-A or deep blue absorbing phosphor may be used as the second wavelength converting material.

The first wavelength range may be for example in the blue, violet, or ultraviolet portion of the optical spectrum. The third wavelength range may be, for example, 380 nm to 400 nm (UV-A) or 400 nm to 420 nm (deep blue).

The first wavelength converting material may comprise for example two or more phosphors of different colors.

The first wavelength converting material may be disposed on the at least one semiconductor LED or remote from the at least one semiconductor LED. The second wavelength converting material may for example be disposed remote from the first wavelength converting material and the at least one semiconductor LED, or mixed with the first wavelength converting material.

A method of operating this light emitting device comprises adjusting a drive power to the activating LED to adjust a spectrum for light output from the light emitting device. For example, the method may comprise adjusting a drive power to the activating LED to adjust a color point or a correlated color temperature of white light output from the light emitting device.

In another aspect of the invention, a light emitting device comprises at least one semiconductor LED configured to emit visible light in a first wavelength range, at least one activating LED configured to emit light in a second wavelength range at shorter wavelengths than the first wavelength range, and a photochromic material disposed in an optical path for light emitted from the activating LED and the semiconductor LED. The photochromic material is convertible from a non-absorbing state to an absorbing state by a reversible photochemical change to the photochromic material induced by absorbing light in the third wavelength range. When in the absorbing state, the photochromic material absorbs light in the first wavelength range more strongly than when it is in the non-absorbing state.

The second wavelength range may be, for example, 380 nm to 400 nm (UV-A) or 400 nm to 420 nm (deep blue).

The photochromic material may be or comprise silver chloride or other silver halides, for example. Any suitable photochromic material may be used.

A method for operating this light emitting device comprises adjusting a drive power to the activating LED to adjust a spectrum for light output from the light emitting device.

The tunable light emitting devices disclosed herein may be used for example in the various devices and applications listed above in the Background section, and may be particularly useful for general illumination (indoors and outdoors), flash light, camera flash light, and human centric lighting applications.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
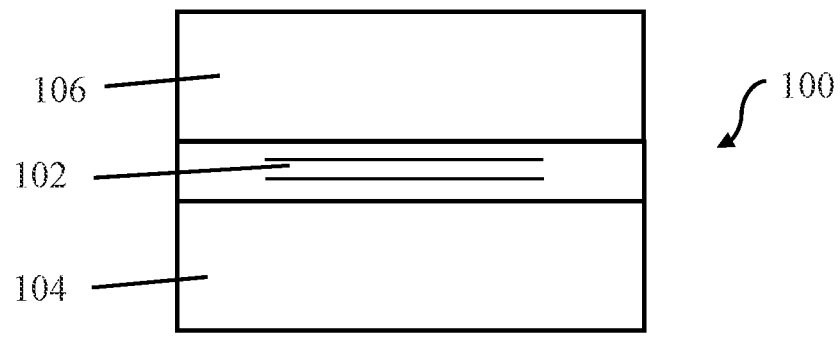
FIG. 1 shows a schematic cross-sectional view of an example pcLED.

FIG. 1 shows an example of an individual pcLED 100 comprising a light emitting semiconductor diode (LED) structure 102 disposed on a substrate 104, and a phosphor layer 106 (which may also be referred to herein as a wavelength converting structure) disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED. Phosphor layers may for example comprise phosphor particles dispersed in or bound to each other with a binder material or be or comprise a sintered ceramic phosphor plate.

Figure 2A:
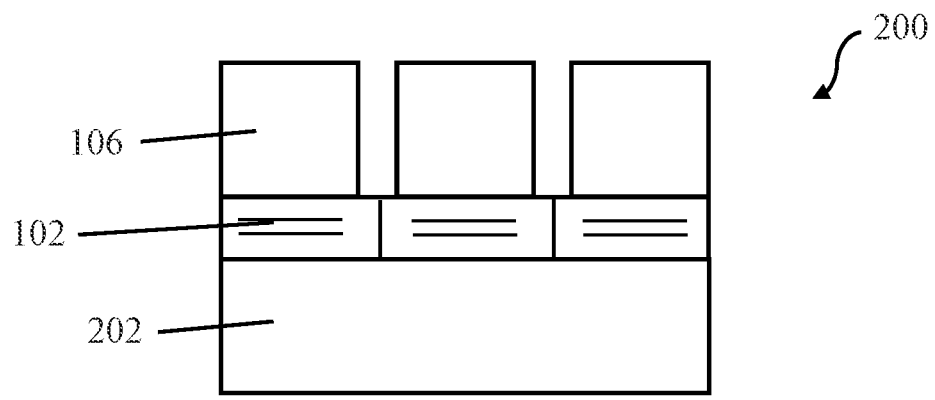
FIGS. 2A and 2B show, respectively, cross-sectional and top schematic views of an array of pcLEDs.
Figure 2B:
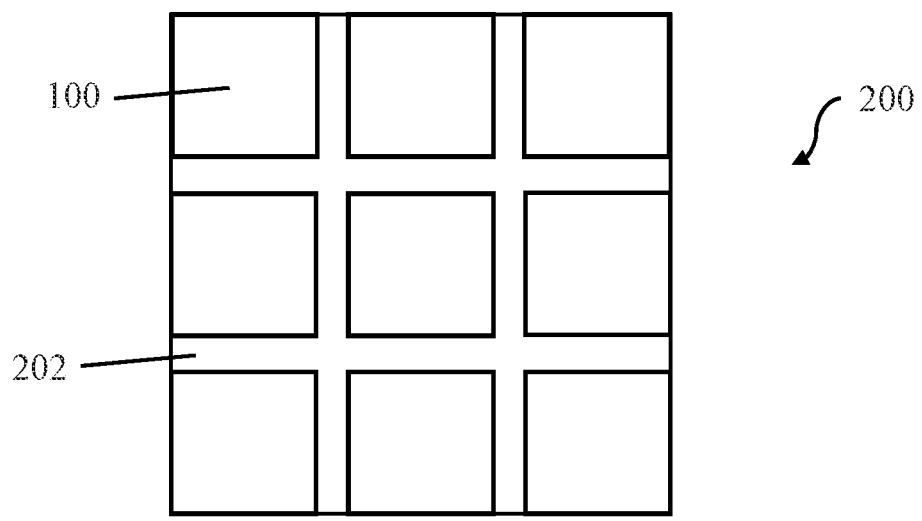

FIGS. 2A-2B show, respectively, cross-sectional and top views of an array 200 of pcLEDs 100 including phosphor layers 106 disposed on a substrate 202. Such an array may include any suitable number of pcLEDs arranged in any suitable manner. In the illustrated example the array is depicted as formed monolithically on a shared substrate, but alternatively an array of LEDs or pcLEDs may be formed from individual mechanically separate LEDs or pcLEDs. Substrate 202 may optionally comprise CMOS circuitry for driving the LEDs and may be formed from any suitable materials.

Although FIGS. 2A-2B show a three-by-three array of nine pcLEDs, such arrays may include for example tens, hundreds, or thousands of LEDs or pcLEDs. Individual LEDs or pcLEDs may have widths (e.g., side lengths) in the plane of the array of, for example, less than or equal to 1 millimeter (mm), less than or equal to 500 microns, less than or equal to 100 microns, less than or equal to 50 microns, less than or equal to 10 microns, or less than or equal to 5 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular LEDs or pcLEDs arranged in a symmetric matrix, the LEDs or pcLEDs and the array may have any suitable shape or arrangement and need not all be of the same shape or size. For example, LEDs or pcLEDs located in central portions of an array may be larger than those located in peripheral portions of the array. Alternatively, LEDs or pcLEDs located in central portions of an array may be smaller than those located in peripheral portions of the array.

Figure 2C:
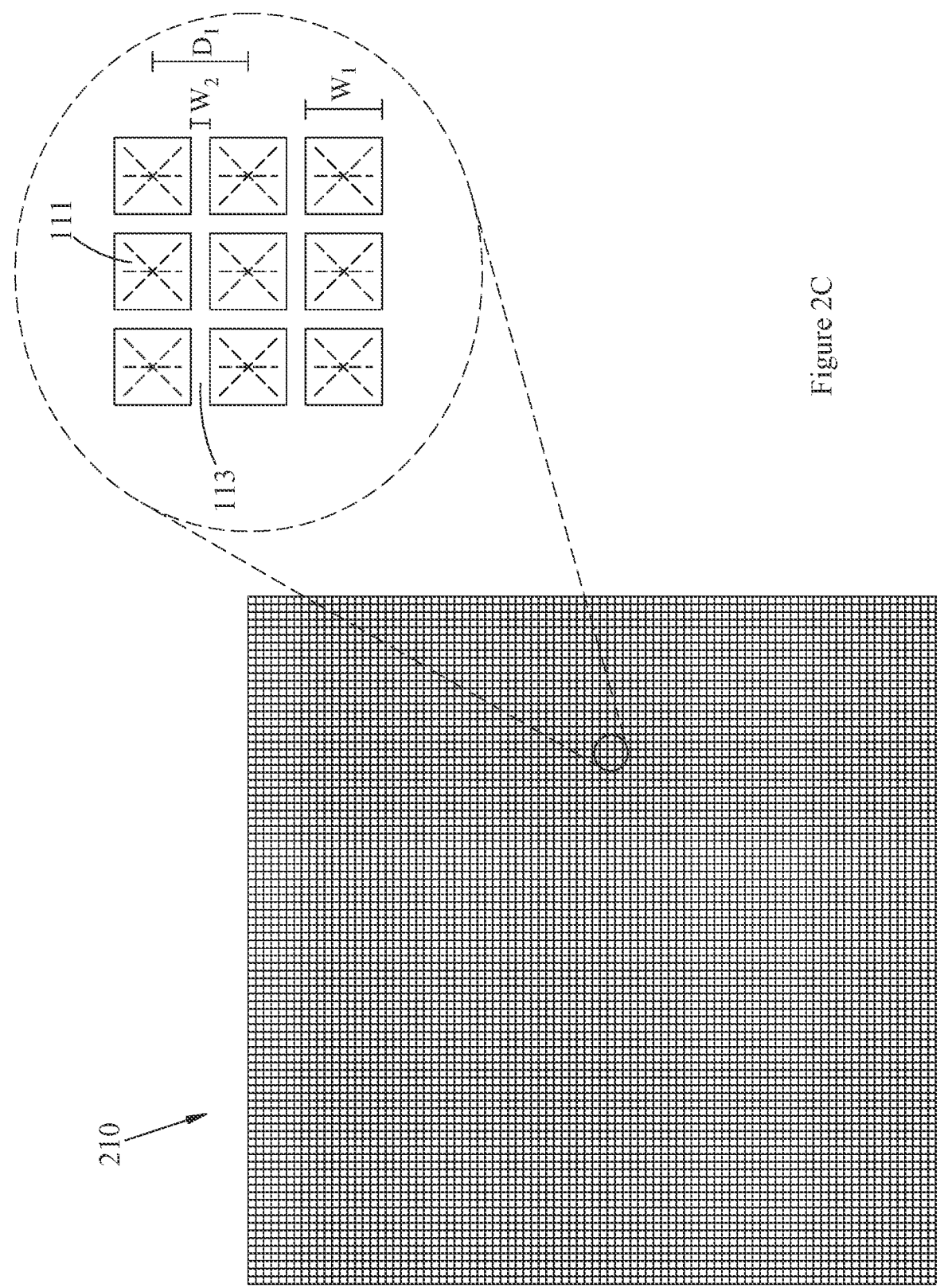
FIG. 2C shows a schematic top view of an LED wafer from which LED arrays such as those illustrated in FIGS. 2A and 2B may be formed.

FIG. 2C shows a schematic top view of a portion of an LED wafer 210 from which LED arrays such as those illustrated in FIGS. 2A and 2B may be formed. FIG. 2C also shows an enlarged 3×3 portion of the wafer. In the example wafer individual LEDs or pcLEDs 111 having side lengths (e.g., widths) of $W_1$ are arranged as a square matrix with neighboring LEDs or pcLEDs having a center-to-center distances $D_1$ and separated by lanes 113 having a width $W_2$. $W_1$ may be, for example, less than or equal to 1 millimeter (mm), less than or equal to 500 microns, less than or equal to 100 microns, less than or equal to 50 microns, or less than or equal to 10 microns. $W_2$ may be, for example, hundreds of microns, less than or equal to 100 microns, less than or equal to 50 microns, less than or equal to 10 microns, or less than or equal to 5 microns. $D_1=W_1+W_2$.

An array may be formed, for example, by dicing wafer 210 into individual LEDs or pcLEDs and arranging the dice on a substrate. Alternatively, an array may be formed from the entire wafer 210, or by dividing wafer 210 into smaller arrays of LEDs or pcLEDs.

LEDs or pcLEDs having dimensions in the plane of the array (e.g., side lengths) of less than or equal to about 50 microns are typically referred to as microLEDs, and an array of such microLEDs may be referred to as a microLED array.

In an array of pcLEDs, all pcLEDs may be configured to emit essentially the same spectrum of light. Alternatively, a pcLED array may be a multicolor array in which different pcLEDs in the array may be configured to emit different spectrums (colors) of light by employing different phosphor compositions. Similarly, in an array of direct emitting LEDs (i.e., not wavelength converted by phosphors) all LEDs in the array may be configured to emit essentially the same spectrum of light, or the array may be a multicolor array comprising LEDs configured to emit different colors of light.

The individual LEDs or pcLEDs in an array may be individually operable (addressable) and/or may be operable as part of a group or subset of (e.g., adjacent) LEDs or pcLEDs in the array.

An array of LEDs or pcLEDs, or portions of such an array, may be formed as a segmented monolithic structure in which individual LEDs or pcLEDs are electrically isolated or partially electrically isolated from each other by trenches and/or insulating material, but the electrically isolated or partially electrically isolated segments remain physically connected to each other by other portions of the semiconductor structure. For example, in such a monolithic structure the active region and a first semiconductor layer of a first conductivity type (n or p) on one side of the active region may be segmented, and a second unsegmented semiconductor layer of the opposite conductivity type (p or n) positioned on the opposite side of the active region from the first semiconductor layer. The second semiconductor layer may then physically and electrically connect the segmented structures to each other on one side of the active region, with the segmented structures otherwise electrically isolated from each other and thus separately operable as individual LEDs.

An LED or pcLED array may therefore be or comprise a monolithic multicolor matrix of individually operable LED or pcLED light emitters. The LEDs or pcLEDs in the monolithic array may for example be microLEDs as described above.

A single individually operable LED or pcLED or a group of adjacent such LEDs or pcLEDs may correspond to a single pixel (picture element) in a display. For example, a group of three individually operable adjacent LEDs or pcLEDs comprising a red emitter, a blue emitter, and a green emitter may correspond to a single color-tunable pixel in a display.

Figure 3A:
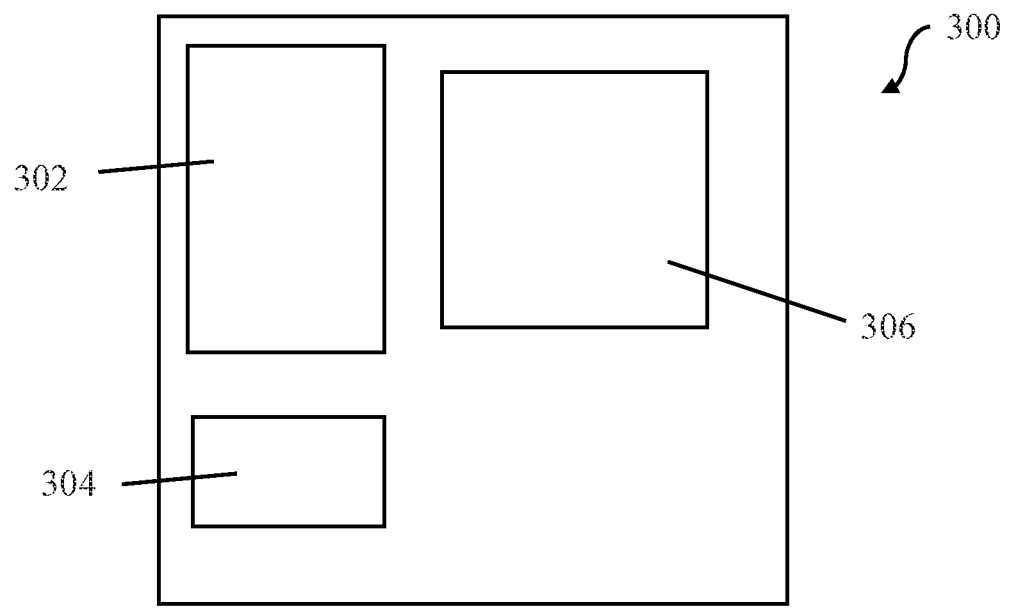
FIG. 3A shows a schematic top view of an electronics board on which an array of pcLEDs may be mounted, and FIG. 3B similarly shows an array of pcLEDs mounted on the electronic board of FIG. 3A.
Figure 3B:
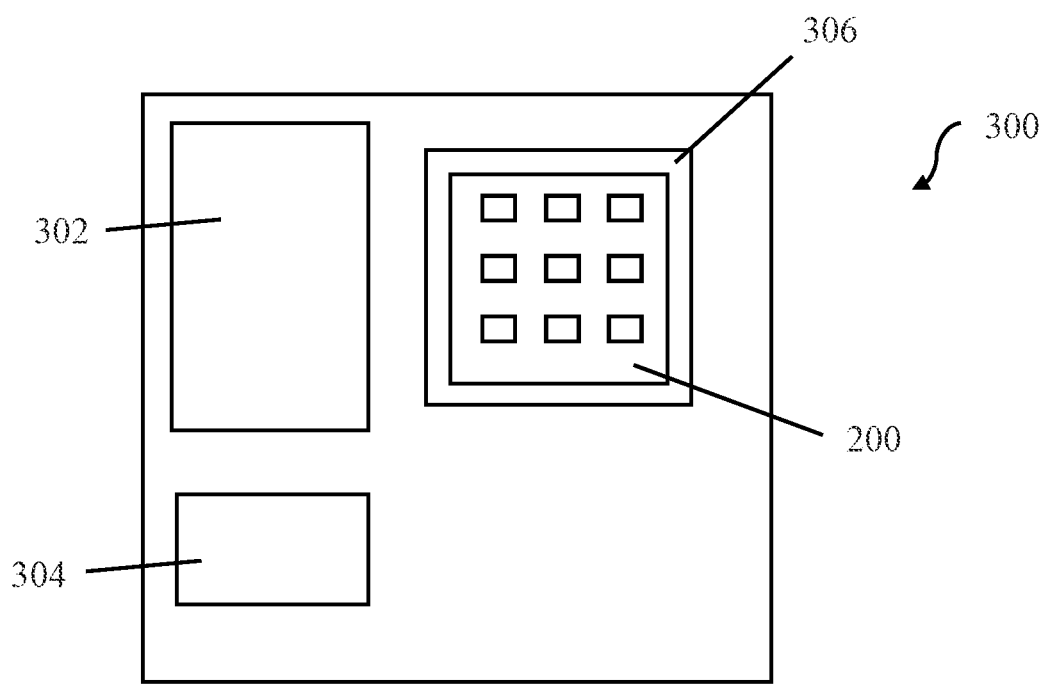

As shown in FIGS. 3A-3B, an LED or pcLED array 200 may for example be mounted on an electronics board 300 comprising a power and control module 302, a sensor module 304, and an attach region 306. Power and control module 302 may receive power and control signals from external sources and signals from sensor module 304, based on which power and control module 302 controls operation of the LEDs/pcLEDs. Sensor module 304 may receive signals from any suitable sensors, for example from temperature or light sensors. Alternatively, array 200 may be mounted on a separate board (not shown) from the power and control module and the sensor module.

Figure 4A:
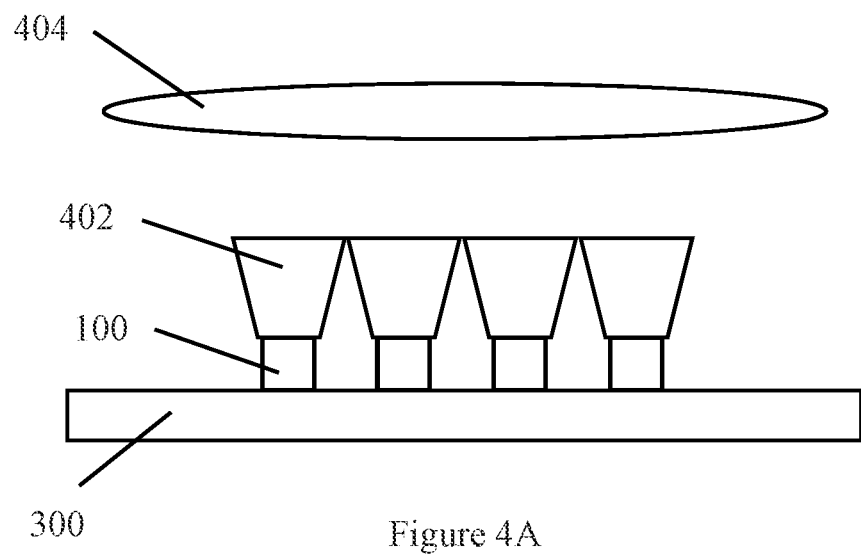
FIG. 4A shows a schematic cross-sectional view of an array of pcLEDs arranged with respect to waveguides and a projection lens.
Figure 4B:
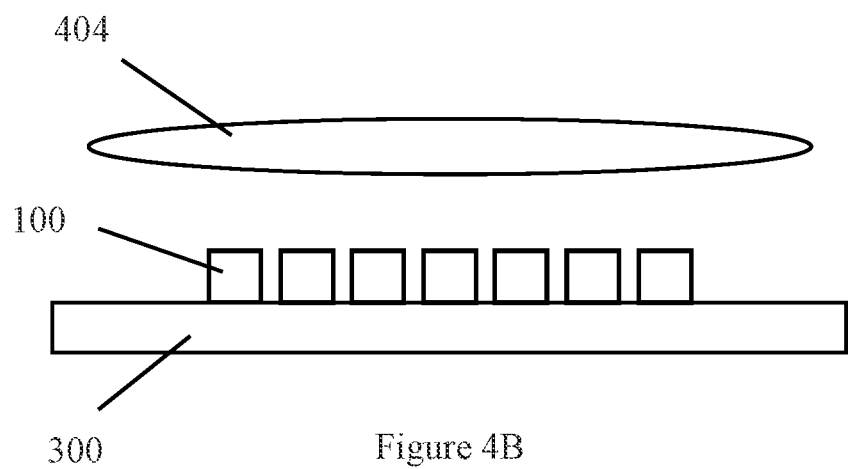
FIG. 4B shows an arrangement similar to that of FIG. 4A, without the waveguides.

Individual LEDs or pcLEDs may optionally incorporate or be arranged in combination with a lens or other optical element located adjacent to or disposed on the LED or the phosphor layer of the pcLED. Such an optical element, not shown in the figures, may be referred to as a "primary optical element". In addition, as shown in FIGS. 4A-4B an array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when LEDs or pcLEDs can be spaced sufficiently close to each other and may also be used in automobile headlights as well as in camera flash applications. A microLED display application may use similar optical arrangements to those depicted in FIGS. 4A-4B, for example.

In another example arrangement, a central block of LEDs or pcLEDs in an array may be associated with a single common (shared) optic, and edge LEDs or pcLEDs located in the array at the periphery of the central bloc are each associated with a corresponding individual optic.

Generally, any suitable arrangement of optical elements may be used in combination with the LED and pcLED arrays described herein, depending on the desired application.

LED and pcLED arrays as described herein may be useful for applications requiring or benefiting from fine-grained intensity, spatial, and temporal control of light distributions. These applications may include, but are not limited to, precise special patterning of emitted light from individual LEDs or pcLEDs or from groups (e.g., blocks) of LEDs or pcLEDs. Depending on the application, emitted light may be spectrally distinct, adaptive over time, and/or environmentally responsive. Such arrays may provide pre-programmed light distribution in various intensity, spatial, or temporal patterns. The emitted light may be based at least in part on received sensor data and may be used for optical wireless communications. Associated electronics and optics may be distinct at an individual LED/pcLED, group, or device level.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g, adaptive headlights), mobile device camera (e.g., adaptive flash), AR, VR, and MR applications such as those described below.

Figure 5:
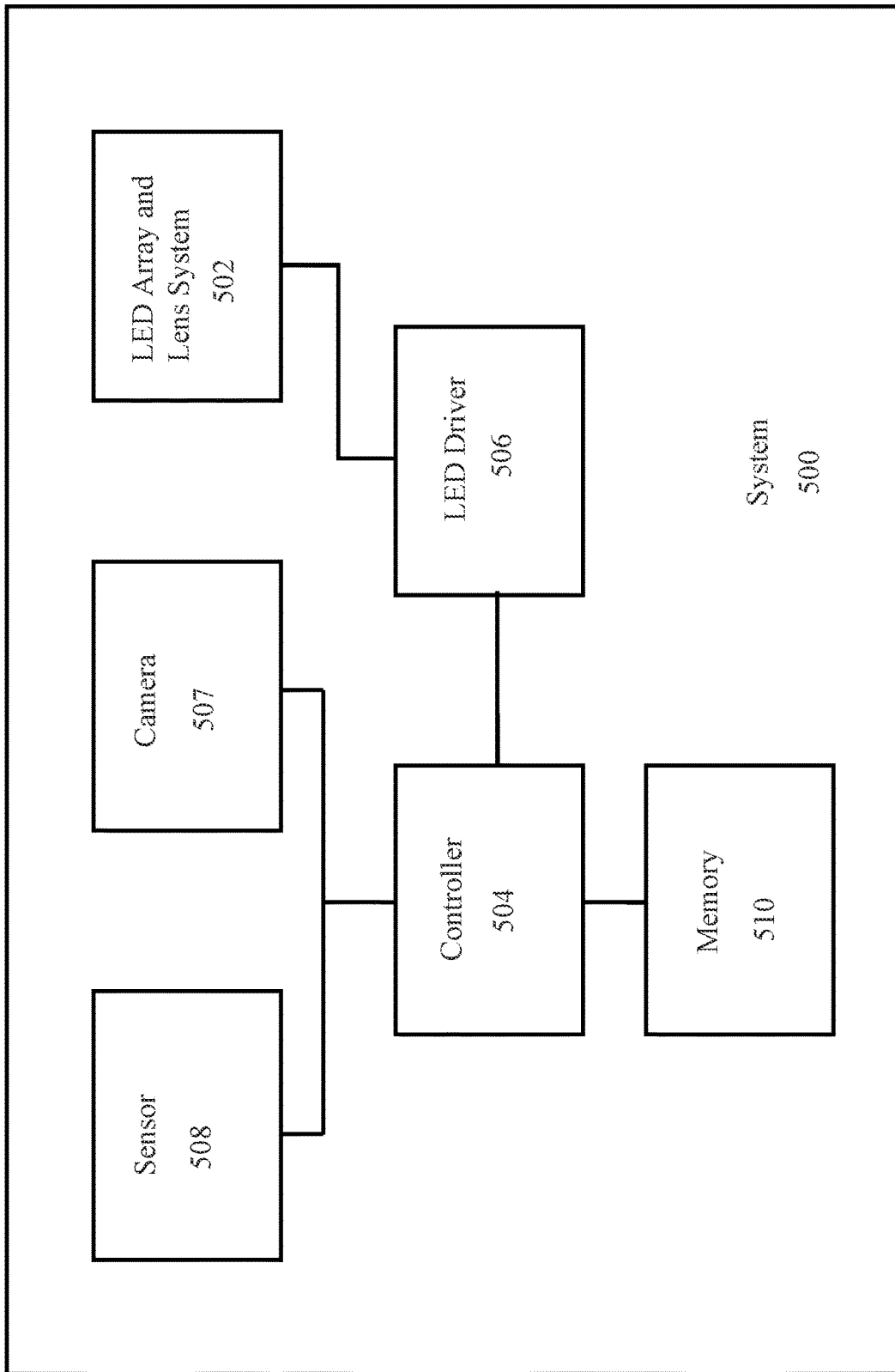
FIG. 5 schematically illustrates an example camera flash system.

FIG. 5 schematically illustrates an example camera flash system 500 comprising an LED or pcLED array and an optical (e.g., lens) system 502, which may be or comprise an adaptive lighting system as described above in which LEDs or pcLEDs in the array may be individually operable or operable as groups. In operation of the camera flash system, illumination from some or all of the LEDs or pcLEDs in array and optical system 502 may be adjusted—deactivated, operated at full intensity, or operated at an intermediate intensity. The array may be a monolithic array, or comprise one or more monolithic arrays, as described above. The array may be a microLED array, as described above.

Flash system 500 also comprises an LED driver 506 that is controlled by a controller 504, such as a microprocessor. Controller 504 may also be coupled to a camera 507 and to sensors 508 and operate in accordance with instructions and profiles stored in memory 510. Camera 507 and LED or pcLED array and lens system 502 may be controlled by controller 504 to, for example, match the illumination provided by system 502 (i.e., the field of view of the illumination system) to the field of view of camera 507, or to otherwise adapt the illumination provided by system 502 to the scene viewed by the camera as described above. Sensors 508 may include, for example, positional sensors (e.g., a gyroscope and/or accelerometer) and/or other sensors that may be used to determine the position and orientation of system 500.

Figure 6:
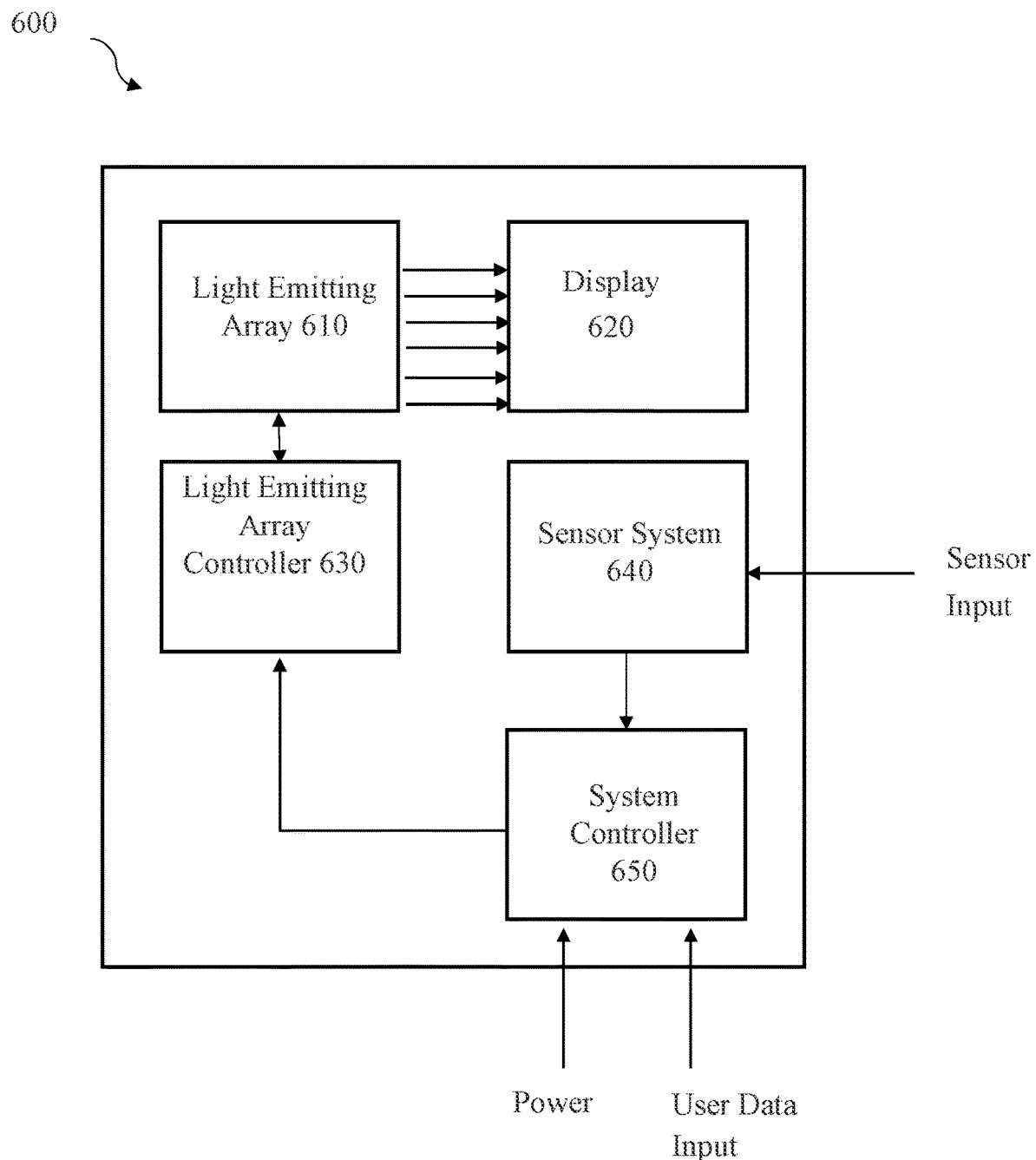
FIG. 6 schematically illustrates an example display (e.g., AR/VR/MR).

FIG. 6 schematically illustrates an example display system 600 that includes an array 610 of LEDs or pcLEDs that are individually operable or operable in groups, a display 620, a light emitting array controller 630, a sensor system 640, and a system controller 650. Array 610 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Similarly, to provide redundancy in the event of a defective LED or pcLED, a group of six individually operable adjacent LEDs or pcLEDs comprising two red emitters, two blue emitters, and two green emitters may correspond to a single color-tunable pixel in the display Array 610 can be used to project light in graphical or object patterns that can for example support AR/VR/MR systems.

Sensor input is provided to the sensor system 640, while power and user data input is provided to the system controller 650. In some embodiments modules included in system 600 can be compactly arranged in a single structure, or one or more elements can be separately mounted and connected via wireless or wired communication. For example, array 610, display 620, and sensor system 640 can be mounted on a headset or glasses, with the light emitting array controller and/or system controller 650 separately mounted.

System 600 can incorporate a wide range of optics (not shown) to couple light emitted by array 610 into display 620. Any suitable optics may be used for this purpose.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of a scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 7:
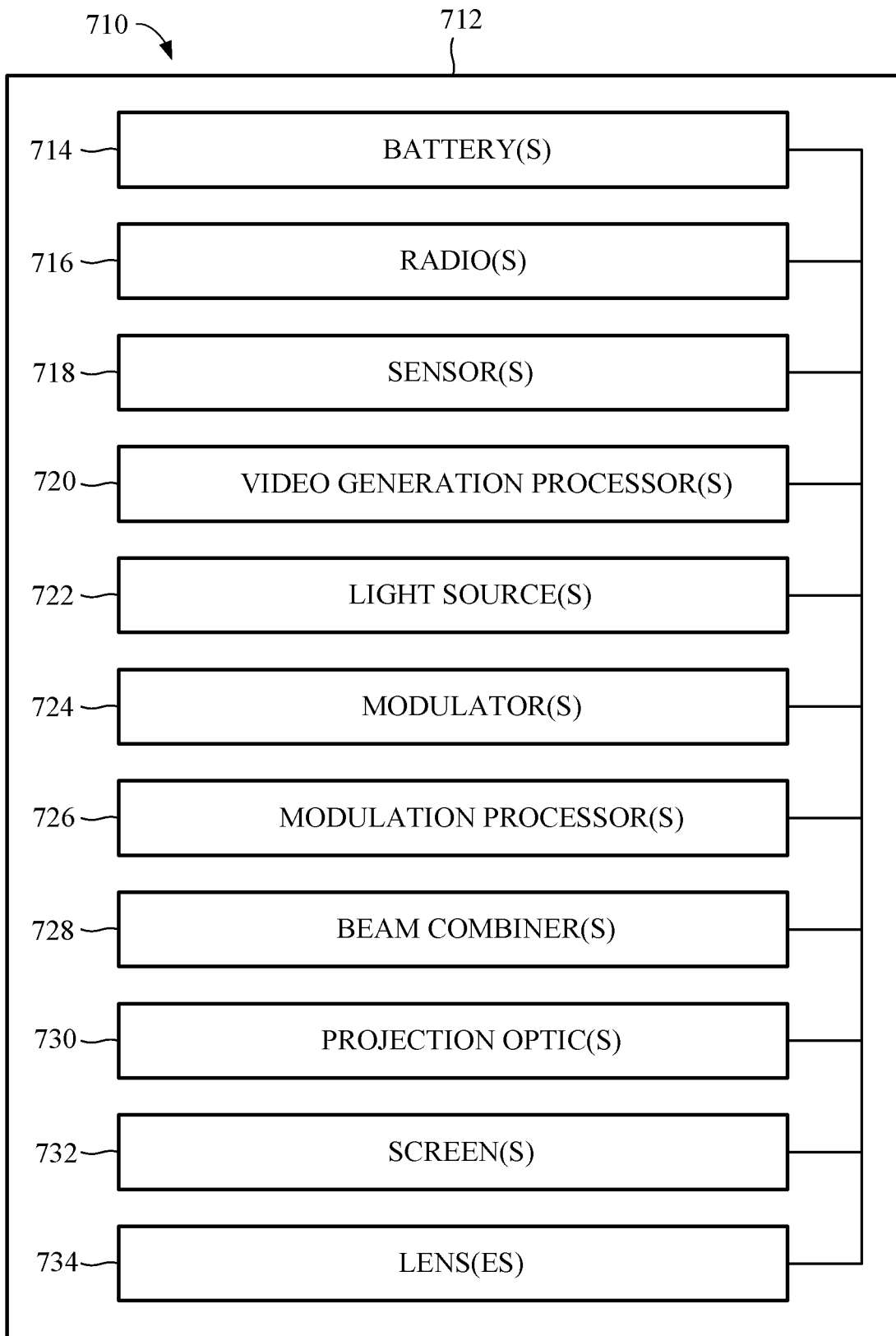
FIG. 7 shows a block diagram of an example visualization system.

FIG. 7 shows a generalized block diagram of an example visualization system 710. The visualization system 710 can include a wearable housing 712, such as a headset or goggles. The housing 712 can mechanically support and house the elements detailed below. In some examples, one or more of the elements detailed below can be included in one or more additional housings that can be separate from the wearable housing 712 and couplable to the wearable housing 712 wirelessly and/or via a wired connection. For example, a separate housing can reduce the weight of wearable goggles, such as by including batteries, radios, and other elements. The housing 712 can include one or more batteries 714, which can electrically power any or all of the elements detailed below. The housing 712 can include circuitry that can electrically couple to an external power supply, such as a wall outlet, to recharge the batteries 714. The housing 712 can include one or more radios 716 to communicate wirelessly with a server or network via a suitable protocol, such as WiFi.

The visualization system 710 can include one or more sensors 718, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 718 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 718 can capture a real-time video image of the surroundings proximate a user.

The visualization system 710 can include one or more video generation processors 720. The one or more video generation processors 720 can receive, from a server and/or a storage medium, scene data that represents a three-dimensional scene, such as a set of position coordinates for objects in the scene or a depth map of the scene. The one or more video generation processors 720 can receive one or more sensor signals from the one or more sensors 718. In response to the scene data, which represents the surroundings, and at least one sensor signal, which represents the location and/or orientation of the user with respect to the surroundings, the one or more video generation processors 720 can generate at least one video signal that corresponds to a view of the scene. In some examples, the one or more video generation processors 720 can generate two video signals, one for each eye of the user, that represent a view of the scene from a point of view of the left eye and the right eye of the user, respectively. In some examples, the one or more video generation processors 720 can generate more than two video signals and combine the video signals to provide one video signal for both eyes, two video signals for the two eyes, or other combinations.

The visualization system 710 can include one or more light sources 722 that can provide light for a display of the visualization system 710. Suitable light sources 722 can include any of the LEDs, pcLEDs, LED arrays, and pcLED arrays discussed above, for example those discussed above with respect to display system 600.

The visualization system 710 can include one or more modulators 724. The modulators 724 can be implemented in one of at least two configurations.

In a first configuration, the modulators 724 can include circuitry that can modulate the light sources 722 directly. For example, the light sources 722 can include an array of light-emitting diodes, and the modulators 724 can directly modulate the electrical power, electrical voltage, and/or electrical current directed to each light-emitting diode in the array to form modulated light. The modulation can be performed in an analog manner and/or a digital manner. In some examples, the light sources 722 can include an array of red light-emitting diodes, an array of green light-emitting diodes, and an array of blue light-emitting diodes, and the modulators 724 can directly modulate the red light-emitting diodes, the green light-emitting diodes, and the blue light-emitting diodes to form the modulated light to produce a specified image.

In a second configuration, the modulators 724 can include a modulation panel, such as a liquid crystal panel. The light sources 722 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 724 can include multiple modulation panels that can modulate different colors of light. For example, the modulators 724 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 724 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 710 can include one or more modulation processors 726, which can receive a video signal, such as from the one or more video generation processors 720, and, in response, can produce an electrical modulation signal. For configurations in which the modulators 724 directly modulate the light sources 722, the electrical modulation signal can drive the light sources 724. For configurations in which the modulators 724 include a modulation panel, the electrical modulation signal can drive the modulation panel.

The visualization system 710 can include one or more beam combiners 728 (also known as beam splitters 728), which can combine light beams of different colors to form a single multi-color beam. For configurations in which the light sources 722 can include multiple light-emitting diodes of different colors, the visualization system 710 can include one or more wavelength-sensitive (e.g., dichroic) beam splitters 728 that can combine the light of different colors to form a single multi-color beam.

The visualization system 710 can direct the modulated light toward the eyes of the viewer in one of at least two configurations. In a first configuration, the visualization system 710 can function as a projector, and can include suitable projection optics 730 that can project the modulated light onto one or more screens 732. The screens 732 can be located a suitable distance from an eye of the user. The visualization system 710 can optionally include one or more lenses 734 that can locate a virtual image of a screen 732 at a suitable distance from the eye, such as a close-focus distance, such as 500 mm, 750 mm, or another suitable distance. In some examples, the visualization system 710 can include a single screen 732, such that the modulated light can be directed toward both eyes of the user. In some examples, the visualization system 710 can include two screens 732, such that the modulated light from each screen 732 can be directed toward a respective eye of the user. In some examples, the visualization system 710 can include more than two screens 732. In a second configuration, the visualization system 710 can direct the modulated light directly into one or both eyes of a viewer. For example, the projection optics 730 can form an image on a retina of an eye of the user, or an image on each retina of the two eyes of the user.

For some configurations of augmented reality systems, the visualization system 710 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

As summarized above, this specification discloses color tunable light emitting devices comprising LEDs and/or pcLEDs. The output spectrum of these devices is tunable by controlling emission from an activating LED to activate absorption by a photochromic material in the light output optical path of the device. Alternatively, the emission from the activating LED may induce emission from a wavelength converting material not otherwise active during operation of the light emitting device. In yet another alternative, the emission from the activating LED may activate absorption by a photochromic material in the light output optical path of the device and induce emission from a wavelength converting material not otherwise active during operation of the light emitting device.

As used herein the term photochromic material refers to a material that undergoes a reversible photochemical change (for example, ionization, ionization to produce free electrons, or isomerization) upon absorbing light in a particular spectral range, with the photochemical change causing a reversible change in the material's absorption spectrum. The change in the material's absorption spectrum typically depends on the wavelength and intensity of light with which it is illuminated and the duration of illumination. Photochromic materials differ from thermochromic materials in that absorption spectrum changes in the latter types of materials are driven by heat (from any source), not by photochemistry.

Figure 8:
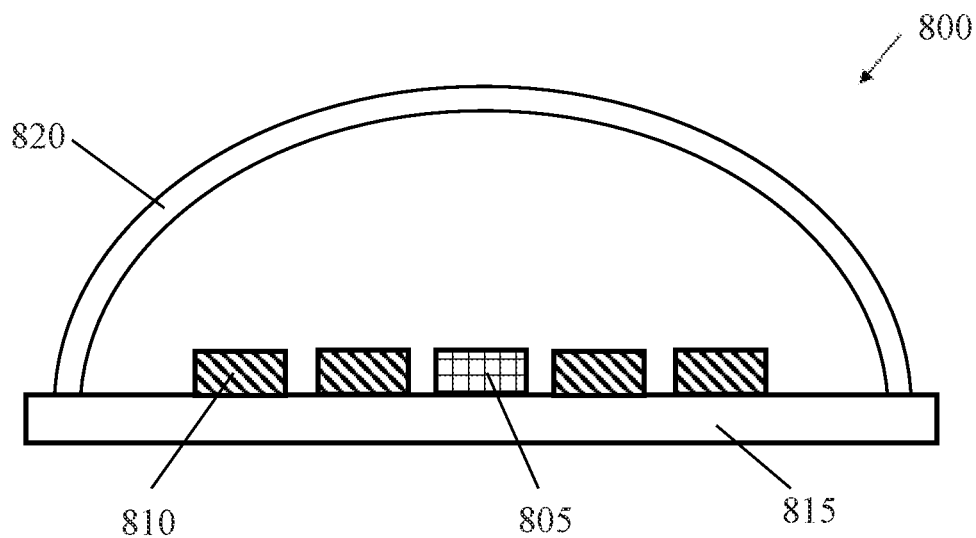
FIG. 8 shows a schematic cross-sectional view of an example color tunable light emitting device.

FIG. 8 shows a schematic cross-sectional view of an example color tunable light emitting device 800. The device comprises an activating LED 805 and direct emitting (i.e., not phosphor converted) LEDs 810 disposed on a substrate (e.g., a printed circuit board) 815, and a layer 820 comprising wavelength converting (e.g., phosphor) material and photochromic material located remotely from (i.e., spaced apart from) LEDs 810 and activating LED 805.

LEDs 810 may emit blue light, for example, and activating LED 805 may emit deep blue or UV light, for example.

LEDs 810 may be operated to excite (for example, green, yellow, and/or red) emission from the wavelength converting material in layer 820, which in combination with any unabsorbed blue light from LEDs 810 forms an output light beam from device 800. Activating LED 805 may be operated to excite and activate the photochromic material in layer 820, which upon activation absorbs a selected portion of the emission from the phosphor materials and of the otherwise unabsorbed blue light. Absorption by the photochromic material alters the spectrum of the output light from the device. The strength of absorption by the photochromic material depends on the intensity and duration of illumination by the activating LED. Thus, the spectrum of the light output from the device may be controlled by controlling the drive power to the activating LED and the duration for which it operates.

For example, with activating LED 805 not operating, the output from the light emitting device may be white with a particular correlated color temperature and (x, y) color point in a 1931 CIE Chromaticity diagram. Driving the activating LED 705 (e.g., at different powers or for different periods of time) to activate the photochromic material may tune the output spectrum of the light emitting device, for example maintaining a white output but with different correlated color temperatures and color points.

The wavelength converting materials and the photochromic material may be mixed with each other in layer 820. Alternatively, layer 820 may comprise separate layers of wavelength converting materials and photochromic materials.

Figure 9:
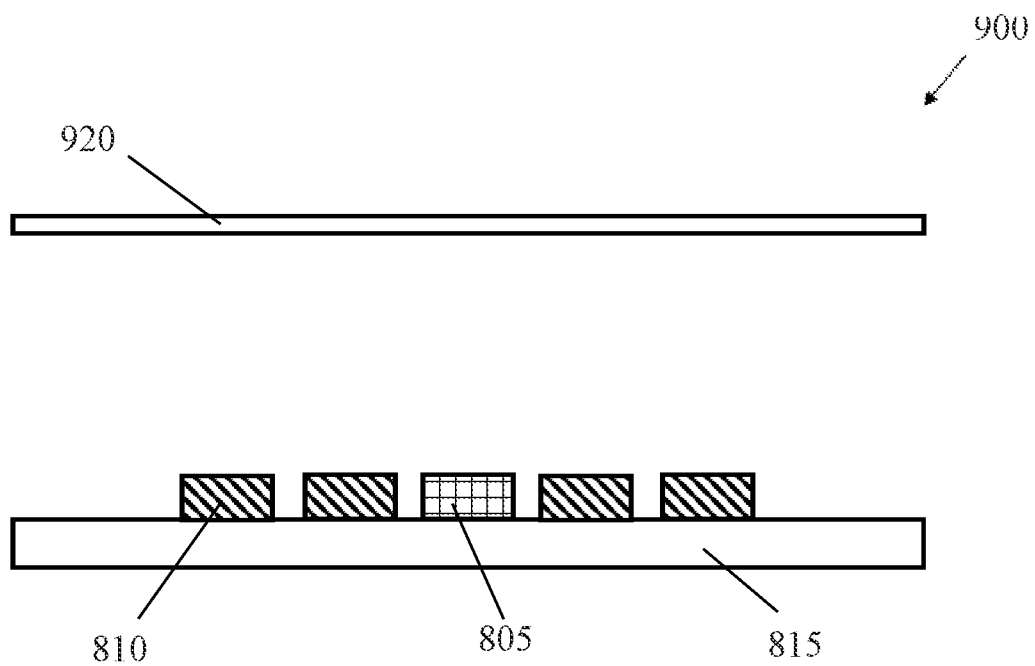
FIG. 9 shows a schematic cross-sectional view of another example color tunable light emitting device.

Layer 820 shown in FIG. 8 has a dome shape. Device 900 shown in FIG. 9 is similar to device 800 of FIG. 8, except that layer 920 comprising wavelength converting material and photochromic material is planar. Any suitable shape and arrangement may be used for the layer comprising wavelength converting material and photochromic material.

Figure 10:
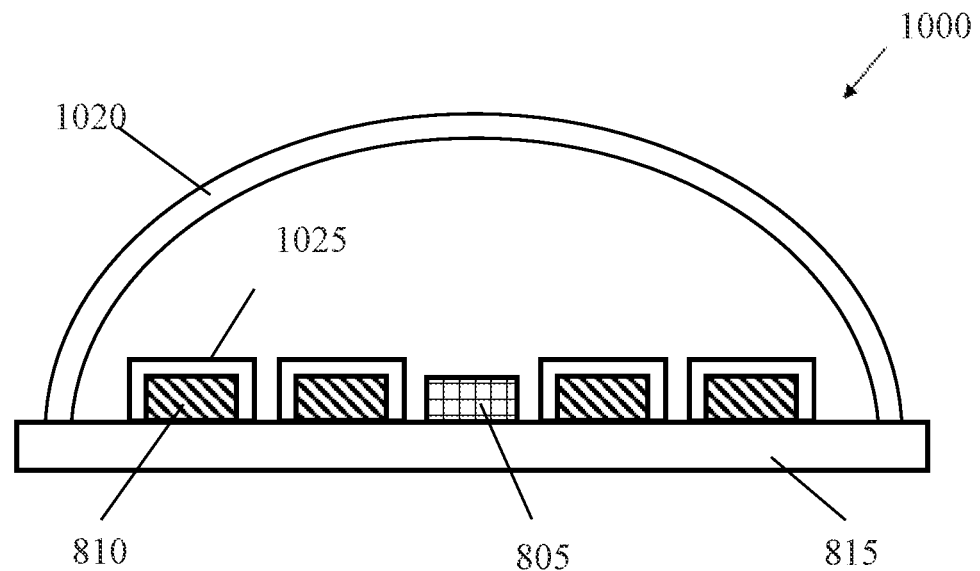
FIG. 10 shows a schematic cross-sectional view of another example color tunable light emitting device.

FIG. 10 shows a schematic cross-sectional view of an example color tunable light emitting device 1000. The device comprises an activating LED 805 and direct emitting LEDs 810 disposed on a substrate 815, a layer 1020 comprising photochromic material located remotely from (i.e., spaced apart from) LEDs 810 and activating LED 805, and wavelength converting (e.g., phosphor) layers 1025 disposed on LEDs 810. Device 1000 may be operated similarly to devices 800 and 900 discussed above.

Figure 11:
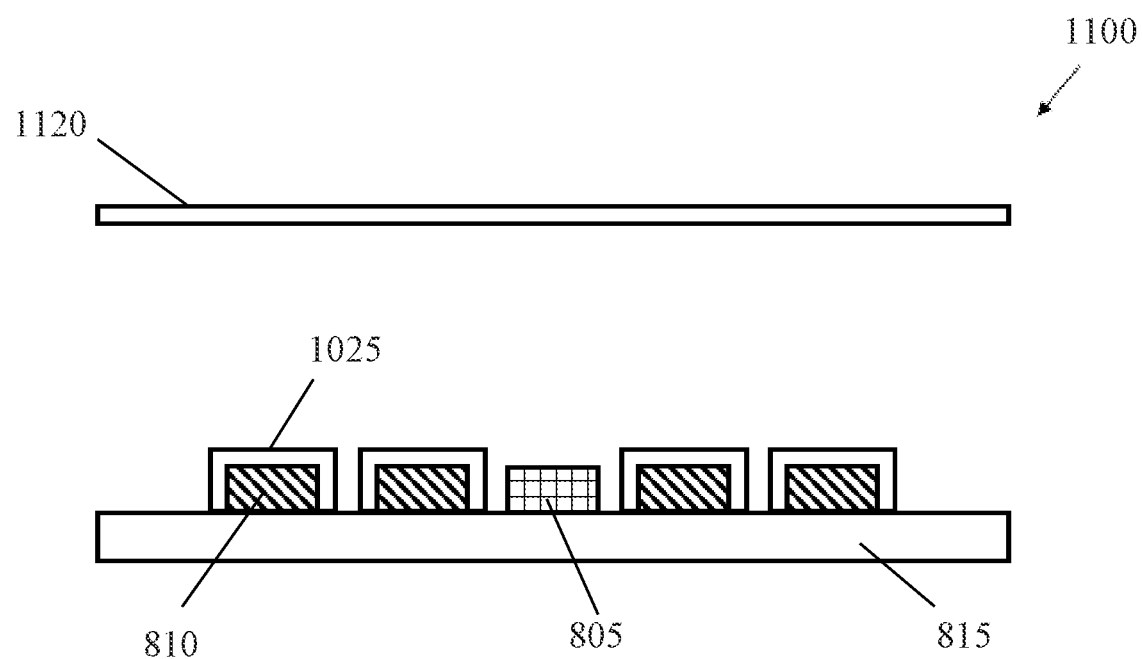
FIG. 11 shows a schematic cross-sectional view of another example color tunable light emitting device.

Device 1100 in FIG. 11 is similar to device 1000 of FIG. 10, except that layer 1120 comprising photochromic material is planar rather than domed. Any suitable shape and arrangement may be used for the layer comprising photochromic material.

Devices 800, 900, 1000, and 1100 described above may be modified to eliminate the wavelength converting material. The light output from such a device is a mixed direct output from LEDs 810. The output spectrum from the light emitting device may be tuned by driving the activating LED 805 to activate the photochromic material, as described above. In such variations different ones of the LEDs 810 may emit different colors of light.

Devices 800, 900, 1000, and 1100 described above may be modified by substituting for the photochromatic material an additional wavelength converting material that absorbs light emitted by activating LED 805 (but does not strongly absorb light emitted by LEDs 810), and in response emits longer wavelength light.

Alternatively, devices 800, 900, 1000, and 1100 may be modified to add the additional wavelength converting material in combination with the photochromic material. The additional wavelength converting material may for example be disposed in layers 820 and 920 as a separate layer, mixed with the other wavelength converting material, or mixed with photochromic material. The additional wavelength converting material may for example be disposed in layers 1020 and 1120 as a separate layer or mixed with photochromic material.

For devices comprising the additional wavelength converting material, activating LED 805 may be operated to excite emission from the additional wavelength converting material and thereby alter the spectrum of the light output from the device. Thus, the spectrum of the light output from the device may be controlled by controlling the drive power to the activating LED.

For example, with activating LED 805 not operating, the output from the light emitting device may be white with a particular correlated color temperature and (x, y) color point in a 1931 CIE Chromaticity diagram. Driving the activating LED 805 (e.g., at different powers) to excite the additional wavelength converting material may tune the output spectrum of the light emitting device, for example maintaining a white output but with different correlated color temperatures and color points.

Figure 12:
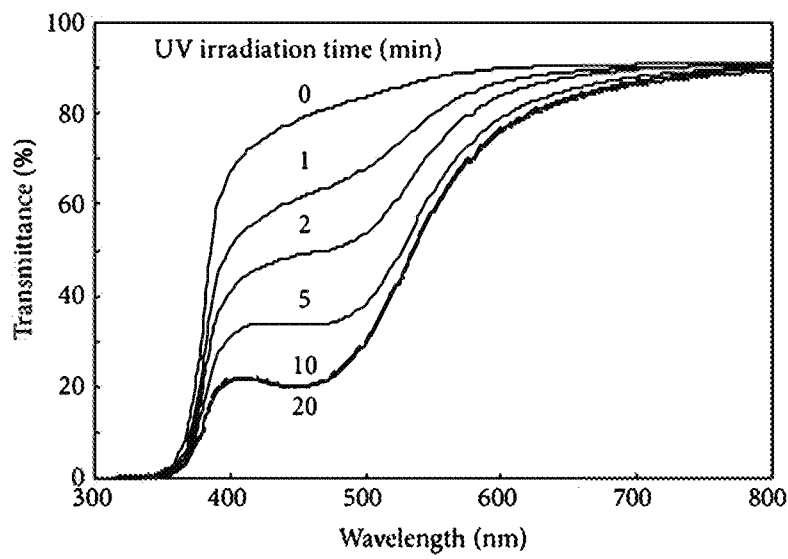
FIG. 12 shows transmission spectra for an example photochromic material as a function of UV irradiation time.

FIG. 12 shows transmission spectra for a photochromic sample of a silver chloride and copper chloride dispersed in a urethane resin glass as a function of UV irradiation time. This material is described in Advances In Material Science And Engineering Volume 2013, Article ID 854928. As shown in FIG. 12 the transmission spectrum becomes less transmissive and changes in shape with time. This allows such a material to be used to tune the output spectrum of a light source as described above.

Figure 13:
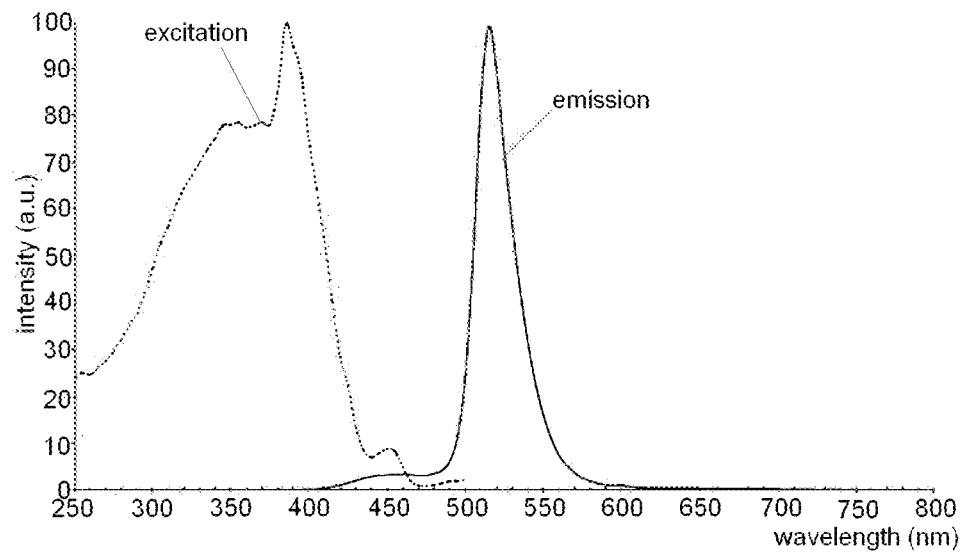
FIG. 13 shows excitation and emission spectra for an example wavelength conversion material.

FIG. 13 shows excitation and emission spectra for an example wavelength conversion material that absorbs strongly in the deep blue and UV-A spectral ranges and can be used as described above in combination with an activating LED to tune the output spectrum of a light source. This and other UV absorbing phosphor materials are available from LDP LLC of Carlstadt, New Jersey.

The following enumerated clauses provide additional non-limiting aspects of the disclosure.

1. A light emitting device comprising:
    at least one semiconductor LED configured to emit light in a first wavelength range;
    a wavelength converting material disposed in an optical path for light emitted from the semiconductor LED and configured to absorb light in the first wavelength range and in response emit light in a second wavelength range of longer wavelength;
    at least one activating LED configured to emit light in a third wavelength range at shorter wavelengths than the first wavelength range; and
    a photochromic material disposed in an optical path for light emitted from the activating LED and the wavelength converting material or from the activating LED, the wavelength converting material, and the semiconductor LED, the photochromic material:
        convertible from a non-absorbing state to an absorbing state by a reversible photochemical change to the photochromic material induced by absorbing light in the third wavelength range,
        when in the absorbing state absorbing light in the first wavelength range and the second wavelength range more strongly than when in the non-absorbing state.

2. The light emitting device of clause 1, wherein the first wavelength range is in the blue, violet, or ultraviolet portion of the optical spectrum.

3. The light emitting device of clause 2, wherein the third wavelength range is 380 nm to 400 nm.

4. The light emitting device of clause 2, wherein the third wavelength range is 400 nm to 420 nm.

5. The light emitting device of clause 1, wherein the wavelength converting material comprises two or more phosphors of different colors.

6. The light emitting device of clause 1, wherein an output from the light emitting device formed from light emitted by the wavelength converting material and light emitted by the semiconductor LED is white with a first color point when the photochromic material is in the non-absorbing state and white with a color point different from the first color point when the photochromic material is in the absorbing state.

7. The light emitting device of clause 1, wherein the photochromic material is or comprises silver halide.

8. The light emitting device of clause 1, wherein the wavelength converting material is disposed on the at least one semiconductor LED.

9. The light emitting device of clause 8, wherein the photochromic material is disposed remote from the wavelength converting material and the at least one semiconductor LED.

10. The light emitting device of clause 1, wherein the wavelength converting material is disposed remote from the at least one semiconductor LED.

11. The light emitting device of clause 10, wherein the photochromic material is mixed with the wavelength converting material.

12. The light emitting device of clause 1, comprising a second wavelength converting material disposed in an optical path for light emitted from the activating LED and configured to absorb light in the third wavelength range and in response emit light in a fourth wavelength range of longer wavelength than the third wavelength range.

13. A method of operating the light emitting device of any of clauses 1-12, comprising adjusting a drive power to the activating LED to adjust a spectrum for light output from the light emitting device.

14. A method of operating the light emitting device of any of clauses 1-12, comprising adjusting a drive power to the activating LED to adjust a color point of white light output from the light emitting device.

15. A light emitting device comprising:
at least one semiconductor LED configured to emit light in a first wavelength range;
a first wavelength converting material disposed in an optical path for light emitted from the semiconductor LED and configured to absorb light in the first wavelength range and in response emit light in a second wavelength range of longer wavelength;
at least one activating LED configured to emit light in a third wavelength range at shorter wavelengths than the first wavelength range; and
a second wavelength converting material disposed in an optical path for light emitted from the activating LED, the second wavelength converting material:
configured to absorb light in the third wavelength range and in response emit light in a fourth wavelength range of longer wavelength than the third wavelength range, and
not strongly absorbing light in the first wavelength range.

16. The light emitting device of clause 15, wherein the first wavelength range is in the blue, violet, or ultraviolet portion of the optical spectrum.

17. The light emitting device of clause 16, wherein the third wavelength range is 380 nm to 400 nm.

18. The light emitting device of clause 16, wherein the third wavelength range is 400 nm to 420 nm.

19. The light emitting device of clause 15, wherein the wavelength converting material is disposed on the at least one semiconductor LED.

20. The light emitting device of clause 19, wherein the second wavelength converting material is disposed remote from the first wavelength converting material and the at least one semiconductor LED.

21. The light emitting device of clause 15, wherein the first wavelength converting material is disposed remote from the at least one semiconductor LED.

22. The light emitting device of clause 21, wherein the second wavelength converting material is mixed with the first wavelength converting material.

23. A method of operating the light emitting device of any of clauses 15-22, comprising adjusting a drive power to the activating LED to adjust a spectrum for light output from the light emitting device.

24. A method of operating the light emitting device of any of clauses 15-22, comprising adjusting a drive power to the activating LED to adjust a color point of white light output from the light emitting device.

25. A light emitting device comprising:
at least one semiconductor LED configured to emit visible light in a first wavelength range;
at least one activating LED configured to emit light in a second wavelength range at shorter wavelengths than the first wavelength range; and
a photochromic material disposed in an optical path for light emitted from the activating LED and the semiconductor LED, the photochromic material:
convertible from a non-absorbing state to an absorbing state by a reversible photochemical change to the photochromic material induced by absorbing light in the third wavelength range,
when in the absorbing state absorbing light in the first wavelength range more strongly than when in the non-absorbing state.

26. The light emitting device of clause 25, wherein the second wavelength range is 380 nm to 400 nm.

27. The light emitting device of clause 25, wherein the second wavelength range is 400 nm to 420 nm.

28. The light emitting device of clause 25, wherein the photochromic material is or comprises silver halide.

29. A method of operating the light emitting device of any of clauses 25-28, comprising adjusting a drive power to the activating LED to adjust a spectrum for light output from the light emitting device.

This disclosure is illustrative and not limiting. Further modifications will be apparent to one skilled in the art in light of this disclosure and are intended to fall within the scope of the appended claims.

What is claimed is:

1. A light emitting device comprising:
at least one semiconductor LED configured to emit light in a first wavelength range;
a wavelength converting material disposed in an optical path for light emitted from the semiconductor LED and configured to absorb light in the first wavelength range and in response emit light in a second wavelength range of longer wavelength;
at least one activating LED configured to emit light in a third wavelength range at shorter wavelengths than the first wavelength range; and
a photochromic material disposed in an optical path for light emitted from the activating LED and the wavelength converting material or from the activating LED, the wavelength converting material, and the semiconductor LED, the photochromic material:
convertible from a non-absorbing state to an absorbing state by a reversible photochemical change to the photochromic material induced by absorbing light in the third wavelength range, when in the absorbing state absorbing light in the first wavelength range and the second wavelength range more strongly than when in the non-absorbing state.

2. The light emitting device of claim 1, wherein the first wavelength range is in the blue, violet, or ultraviolet portion of the optical spectrum.

3. The light emitting device of claim 2, wherein the third wavelength range is 380 nm to 400 nm.

4. The light emitting device of claim 2, wherein the third wavelength range is 400 nm to 420 nm.

5. The light emitting device of claim 1, wherein the wavelength converting material comprises two or more phosphors of different colors.

6. The light emitting device of claim 1, wherein an output from the light emitting device formed from light emitted by the wavelength converting material and light emitted by the semiconductor LED is white with a first color point when the photochromic material is in the non-absorbing state and white with a color point different from the first color point when the photochromic material is in the absorbing state.

7. The light emitting device of claim 1, wherein the photochromic material is or comprises silver halide.

8. The light emitting device of claim 1, wherein the wavelength converting material is disposed on the at least one semiconductor LED.

9. The light emitting device of claim 8, wherein the photochromic material is disposed remote from the wavelength converting material and the at least one semiconductor LED.

10. The light emitting device of claim 1, wherein the wavelength converting material is disposed remote from the at least one semiconductor LED.

11. The light emitting device of claim 10, wherein the photochromic material is mixed with the wavelength converting material.

12. The light emitting device of claim 1, comprising a second wavelength converting material disposed in an optical path for light emitted from the activating LED and configured to absorb light in the third wavelength range and in response emit light in a fourth wavelength range of longer wavelength than the third wavelength range.

13. A light emitting device comprising:
at least one semiconductor LED configured to emit light in a first wavelength range;
a first wavelength converting material disposed in an optical path for light emitted from the semiconductor LED and configured to absorb light in the first wavelength range and in response emit light in a second wavelength range of longer wavelength;
at least one activating LED configured to emit light in a third wavelength range at shorter wavelengths than the first wavelength range; and
a second wavelength converting material disposed in an optical path for light emitted from the activating LED, the second wavelength converting material:
configured to absorb light in the third wavelength range and in response emit light in a fourth wavelength range of longer wavelength than the third wavelength range, and
not strongly absorbing light in the first wavelength range.

14. The light emitting device of claim 13, wherein the first wavelength range is in the blue, violet, or ultraviolet portion of the optical spectrum.

15. The light emitting device of claim 14, wherein the third wavelength range is 380 nm to 400 nm.

16. The light emitting device of claim 14, wherein the third wavelength range is 400 nm to 420 nm.

17. The light emitting device of claim 13, wherein the wavelength converting material is disposed on the at least one semiconductor LED.

18. The light emitting device of claim 17, wherein the second wavelength converting material is disposed remote from the first wavelength converting material and the at least one semiconductor LED.

19. The light emitting device of claim 13, wherein the first wavelength converting material is disposed remote from the at least one semiconductor LED.

20. The light emitting device of claim 19, wherein the second wavelength converting material is mixed with the first wavelength converting material.

21. A light emitting device comprising:
at least one semiconductor LED configured to emit visible light in a first wavelength range;
at least one activating LED configured to emit light in a second wavelength range at shorter wavelengths than the first wavelength range; and
a photochromic material disposed in an optical path for light emitted from the activating LED and the semiconductor LED, the photochromic material:
convertible from a non-absorbing state to an absorbing state by a reversible photochemical change to the photochromic material induced by absorbing light in the third wavelength range,
when in the absorbing state absorbing light in the first wavelength range more strongly than when in the non-absorbing state.

22. The light emitting device of claim 21, wherein the second wavelength range is 380 nm to 400 nm.

23. The light emitting device of claim 21, wherein the second wavelength range is 400 nm to 420 nm.

24. The light emitting device of claim 21, wherein the photochromic material is or comprises silver halide.

* * * * *